United States Patent [19]

Breiter

[11] Patent Number: 4,473,166

[45] Date of Patent: Sep. 25, 1984

[54] CHASSIS CONSTRUCTION PARTICULARLY USEFUL FOR ELECTRONIC EQUIPMENT

[75] Inventor: David Breiter, Raanana, Israel

[73] Assignee: AEL Israel Ltd., Electronics Industries, Bnei Brak, Israel

[21] Appl. No.: 431,202

[22] Filed: Sep. 30, 1982

[30] Foreign Application Priority Data

Apr. 7, 1982 [IL] Israel .................................... 65449

[51] Int. Cl.³ ............................................ A47B 95/02
[52] U.S. Cl. ...................................... 220/76; 312/320; 312/257 SK
[58] Field of Search ...................... 220/4 R, 4 F, 3.94, 220/75, 76, 1.5, 72.1, 83; 312/107, 108, 257 SK, 257 SM, 263, 257 A, 320

[56] References Cited

U.S. PATENT DOCUMENTS

| | | | |
|---|---|---|---|
| 1,807,058 | 5/1931 | Carpenter | 220/76 X |
| 3,506,322 | 4/1970 | Richards | 312/108 |
| 3,901,571 | 8/1975 | Begitschke et al. | 312/263 X |
| 3,987,924 | 10/1976 | Uitz | 220/76 X |
| 4,102,554 | 7/1978 | Reimer | 220/4 R X |
| 4,154,493 | 5/1979 | Prater | 312/257 SK X |
| 4,184,726 | 1/1980 | Cox | 312/257 SK X |

Primary Examiner—Steven M. Pollard
Attorney, Agent, or Firm—Benjamin J. Barish

[57] ABSTRACT

A chassis construction particularly useful for electronic equipment comprises a rectangular supporting panel, front and rear frame members of open rectangular configuration secured to the supporting panel, and a pair of side members. The front and rear frame members are formed with recesses, and the side members are formed with inwardly-extending tongues received in the recesses and secured to the front and rear frame members by fasteners passing through the tongues and recesses to thereby strengthen the chassis against torsion and bending forces.

8 Claims, 3 Drawing Figures

CHASSIS CONSTRUCTION PARTICULARLY USEFUL FOR ELECTRONIC EQUIPMENT

BACKGROUND OF THE INVENTION

The present invention relates to chassis constructions, and particularly to those useful for mounting electronic equipment.

Chassis presently used for mounting electronic equipment are generally constructed of metal sheet material bent to form the main supporting panel, and also the side, end, and/or top panels if such panels are provided. Such chassis constructions, however, usually require substantial thickness of sheet material, and/or other reinforcing means, if the chassis is to provide strength against torsion and bending forces.

An object of the present invention is to provide an inexpensive and light-weight chassis which is constructed so as to have substantial strength against torsion and bending forces even when made of relatively thin sheet material.

SUMMARY OF THE INVENTION

According to a broad aspect of the present invention, there is provided a chassis construction particularly useful for electronic equipment, characterized in that it includes: a main supporting panel of rectangular configuration; a front frame member and a rear frame member each of open rectangular configuration and each including a first leg secured to the front and rear edges, respectively, of the main supporting panel, a second leg spaced from the first leg, and a pair of further legs joining together said first and second legs; and a pair of side members each connecting together one side of the front and rear frame members. The front and rear frame members are formed with recesses in the first and second legs parallel to the side members but spaced inwardly from the edges of the frame members. The side members are formed of sheet material panels having longitudinally-extending flanges at their opposite ends, which flanges terminate in flat, inwardly-bent strips defining inwardly-extending tongues received in said recesses and being secured to said front and rear frame members by fasteners passing through said tongues and recesses to thereby strengthen said chassis against torsion and bending forces.

In the preferred embodiment of the invention described below, the front and rear frame members are of bent sheet material. Thus, the first legs (these being the upper legs in the disclosed embodiment) of the front and rear frame members of L-section. In addition, the chassis construction may further include a top cover panel overlying said front and rear frame members but not said side panels, such that the outer face of said top cover is flush with the outer faces of said side panels.

It has been found that chassis constructed in accordance with the foregoing features provide high strength against torsion and bending forces even when relatively thin metal sheet material is used.

BRIEF DESCRIPTION OF THE DRAWINGS

Further features and advantages of the invention will be apparent from the description below.

The invention is herein described, by way of example only, with reference to accompanying drawings, wherein.

DESCRIPTION OF A PREFERRED EMBODIMENT

Figure 1:
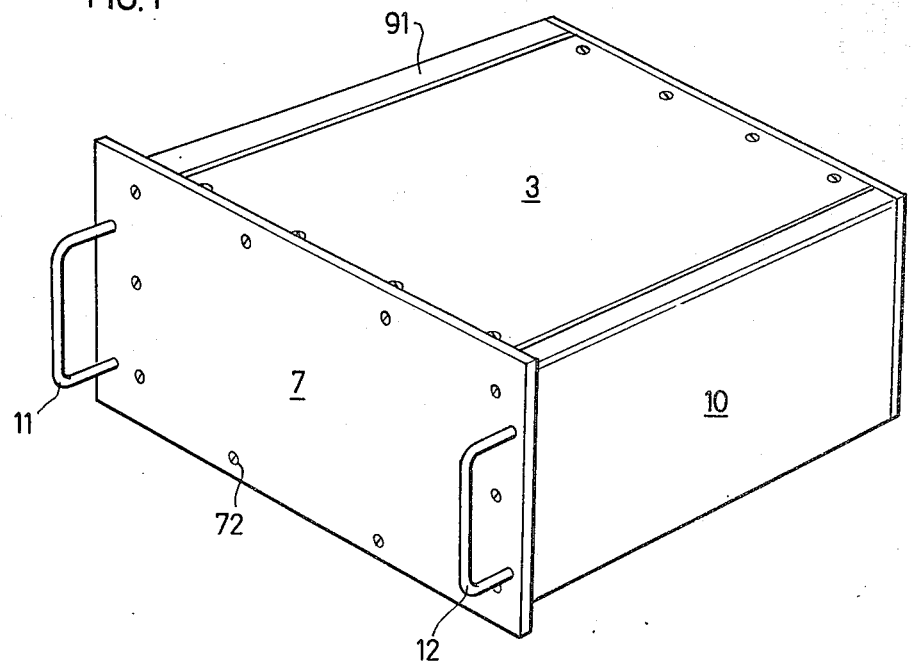
FIG. 1 is a three-dimensional view illustrating one form of chassis constructed in accordance with the present invention.

The chassis construction illustrated in the drawings is particularly useful for mounting electronic equipment on racks. Briefly, it is constructed of the following elements, as more particularly illustrated in FIG. 2: a main supporting panel 2; a top cover panel 3; a bottom cover panel 4; a front frame member 5; a rear frame member 6; a front cover panel 7; a rear cover panel 8; a pair of side panels 9 and 10; and a pair of handles 11 and 12. All the foregoing members, except for the handles, are made of sheet material, e.g., metal sheets.

The construction of each of the foregoing members will first be described with reference to FIG. 2, and the manner of securing them together to form the illustrated chassis will then be described with reference to FIG. 3.

Figure 2:
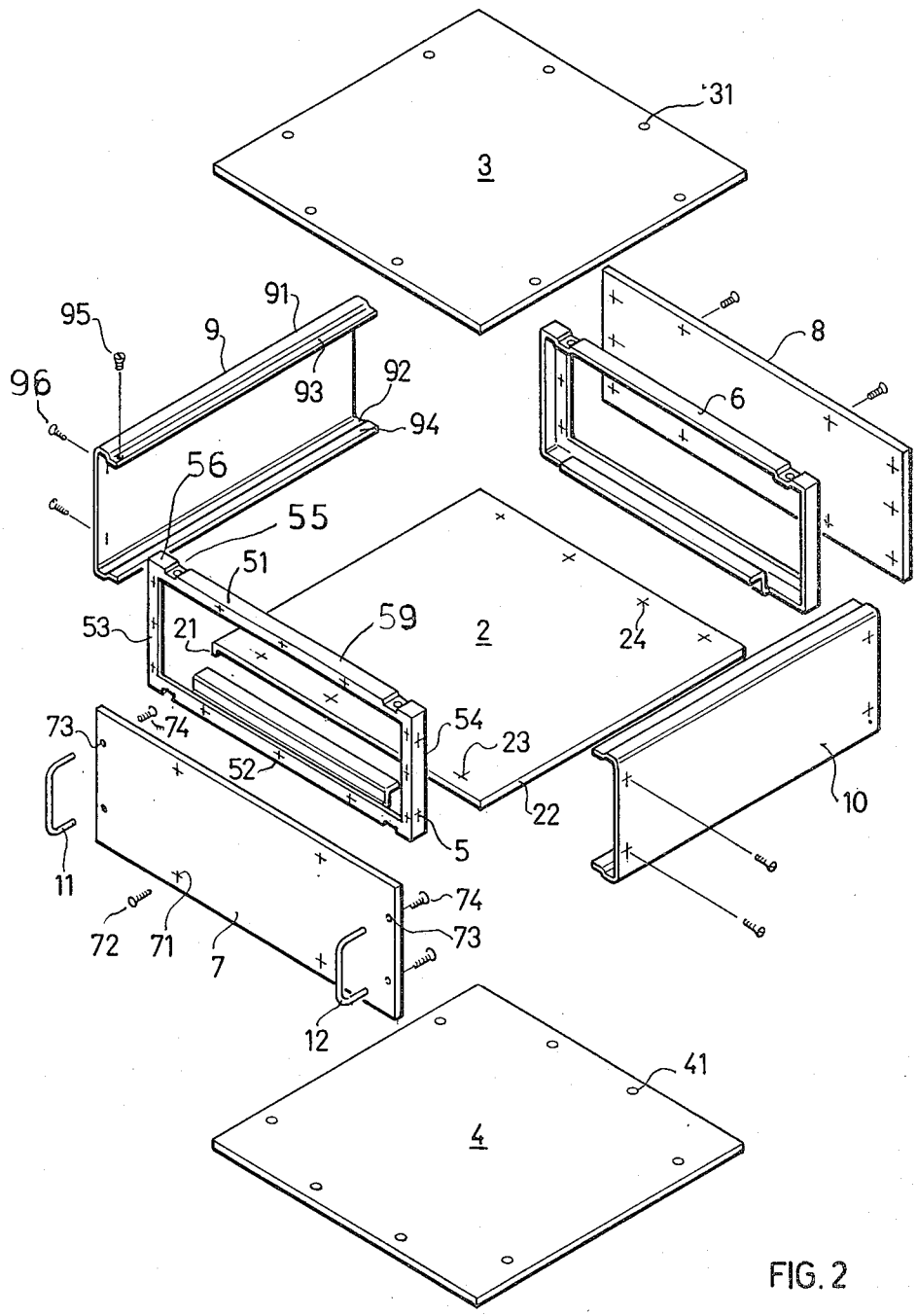
FIG. 2 is an exploded view illustrating the several members in the chassis construction of FIG. 1.

As shown in FIG. 2, the main supporting panel 2 is of flat sheet material of rectangular configuration, and is formed at its two opposite sides with down-turned flanges 21, 22. In addition, panel 2 is formed with a line of openings 23 along its front edge, and with another line of openings 24 along its rear edge for receiving fasteners 25 (FIG. 3).

The top and bottom cover panels 3 and 4, respectively, are also of rectangular configuration but both have a width and a length slightly greater than the main supporting panel 2, so that they both project slightly beyond panel 2 along all four of its peripheral edges. The top and bottom cover panels 3 and 4 are also formed with fastener-receiving openings 31 and 41, respectively.

The front and rear frame members 5 and 6, respectively, are of identical construction; and the front and rear cover panels 7 and 8 are also of identical construction. Accordingly, only the structure of the front frame member 5 and the front cover panel 7 are herein described (these also being illustrated in FIG. 3), it being appreciated that the rear frame member 6 and the rear cover panel 8 are of the same construction.

Thus, the front frame member 5, made of bent sheet material, is of an open rectangular configuration, including an upper leg 51 and a lower leg 52 joined together at their opposite ends by a pair of side legs 53 and 54. As shown particularly in FIG. 3, the upper leg 51 is of L-section being fromed with two right-angle flanges 51a and 51b; whereas the lower leg 52 is of U-section being formed with flanges 52a, 52b and 52c, the latter terminating in a further inwardly-extending flange or ledge 52d. To the latter ledge is secured the main supporting panel 2 by means of fasteners 25.

The upper leg 51 of the front frame member 5 is formed with a longitudinally-extending recess 55 inwardly spaced from the outer edge of the frame member, such that recess 55 defines a groove and the outer portion 56 of the upper leg 51 defines a tongue 56. A similar recess is provided at the opposite end of the upper leg 51 to define a corresponding tongue 56 and groove 55 also at the end.

In addition, the lower leg 52 of the front frame member 5 is similarly configured to provide a recess or groove 57 and a tongue 58 at the two opposite ends of the lower leg.

Further, all four legs 51–54 of the front frame member 5 are formed with openings 59 for receiving fasteners.

The front cover panel 7 is of flat metal sheet material of rectangular configuration. It is formed with a plurality of openings 71 for receiving fasteners 72 secured the panels together, and with further openings 73 for receiving fasteners 74 to which the handles 11 and 12 are secured.

As indicated earlier, the rear frame member 6 and the rear cover panel 8 are of the same construction as the front frame member 5 and front cover panel member 7; however, the handles 11 and 12 are usualy provided only at the front of the chassis.

The two side panels 9 and 10 are also made of bent sheet material. As shown particularly in FIG. 3, side panel 9 is formed with an inturned right-angle flange 91, 92 extending longitudinally along its top and bottom edges. Each of these flanges is bent inwardly at its outer edge, as shown at 93 and 94, to form a flat, inwardly-bent strip defining tongues received within the recesses 55 and 57 in the front and rear frame members 5 and 6. Thus, the inwardly-bent tongue 93 of the upper flange 91 is received within recess 55 of the upper leg 51 of the front frame member 5; whereas the remainder of flange 91 overlies tongue 56 of the front frame member leg 51. Thus, flanges 91 and 92 at the opposite ends of the side panel member 9 define a tongue and groove arrangement cooperable with the grooves 55, 57 and the tongues 56, 58 at the opposite ends of the front frame member 5.

Tongues 93, 94 are formed with openings for receiving fasteners 95, 96 securing the side panel 9 to the front frame member 5, and also to the rear frame member 6.

The other side panel 10 is similarly constructed and is similarly secured to the front and rear frame members 5 and 6.

Figure 3:
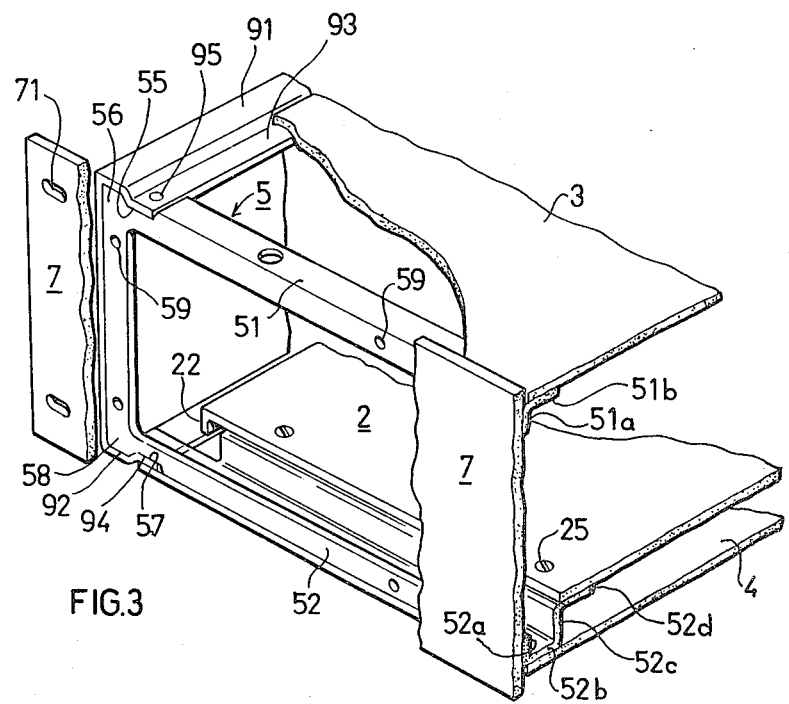
FIG. 3 is an enlarged fragmentary view, with parts broken away to show the internal structure, of the chassis illustrated in FIG. 1.

The manner of assembling the illustrated chassis will be apparent from the above description, and particularly from FIG. 3. Thus, the main supporting panel 2 may be first secured, by fasteners 25, to the ledge 52d of the front frame member 5, and to the corresponding ledge in the rear frame member 6. In so securing the main supporting panel 2, the end flanges 21 and 22 along the longitudinal sides of the main supporting panel 2 are disposed to overlie the recesses 55, 57, at the ends of the upper and lower legs 51, 52, respectively, of the front frame member 5, and the corresponding recesses in the rear frame member 6. The front edge of the main supporting panel is thus inwardly spaced from the outer face of the front and rear frame members 5 and 6 by the width of flange 52b and the thickness of flange 52a. This space is provided for electronic components mounted on the main supporting panel 2.

The side panels 9 and 10 may then be secured to the front and rear frame members 5 and 6, by positioning the outer tongues 93 and 94, respectively, at the opposite ends of side panel 9 (and the corresponding elements in the other side panel 10) in the recesses 55 and 57 of the frame members 5 and 6, so that the flanges 91 and 92 of the side panels form a tongue-and-groove connection with respect to the front and rear frame members 5 and 6. Side panel 9 is then secured to one side of the front and rear frame members 5 and 6 by fasteners 96 passing through the sides (e.g. 53) of the two frame members 5, 6, and by fasteners 95 passing through the tongues 93 and 94 of the recesses 55 and 57. The other side panel 10 is similarly secured to the other side of the front and rear frame members 5 and 6.

To complete the assembly, the front and rear cover panels 7 and 8 are then secured by fasteners to the front and rear frame members 5 and 6; the top cover panel 3 is secured to the upper legs of the front and rear frame members 5 and 6; and the bottom cover panel 4 is secured to the lower legs of the front and rear frame members 5 and 6. As shown particularly in FIG. 3, the dimensions of the top cover panel 3 and bottom cover panel 4 are such that their side edges terminate at the junctures of flanges 91, 92, and their inwardly-extending tongues 93, 94, so that the top and bottom cover panels overlie tongues 93 and 94 of the side panels. The outer faces of the cover panels 3 and 4 are thus flush with the outer faces of the side panels 9 and 10, thereby presenting a neat outer appearance.

As also shown in FIG. 3, the bottom cover panel 4 is secured to the bottom face of the front and rear frame members 5 and 6 so that the main supporting panel 2, secured to ledge 52d of the front and rear frame members 5 and 6, is spaced slightly above the bottom cover panel 4.

It has been found that a chassis constructed as described above and as illustrated in the drawings, may be made of relatively thin sheet material and still provides relatively high strength against both torsion and bending forces. The fasteners illustrated for securing the parts together may be of any known type, for example threaded fasteners or quarter-turn fasteners commonly used for constructing and/or mounting chassis to racks.

While the invention has been described with respect to one preferred embodiment, it will be appreciated that many variations, modifications and other applications of the invention may be made.

What is claimed is:

1. A chassis construction particularly useful for electronic equipment, characterized in that it includes: a main supporting panel of rectangular configuration; a front frame member and a rear frame member each of open rectangular configuration and each including a first leg secured to the front and rear edges, respectively, of the main supporting panel, a second leg spaced from the first leg, and a pair of further legs joining together said first and second legs; and a pair of side members each connecting together one side of the front and rear frame members; said front and rear frame members being formed with recesses in said first and second legs parallel to the side members but spaced inwardly from the edges of the frame members; said side members being of sheet material panels having longitudinally-extending flanges at their opposite ends, which flanges terminate in flat inwardly-bent strips defining inwardly-extending tongues received in said recesses of said front and rear frame members and being secured to said front and rear frame members by fasteners passing through said tongues and recesses to thereby strengthen said chassis against torsion and bending forces.

2. A chassis construction according to claim 1, wherein said front and rear frame members are of bent sheet material.

3. The chassis construction according to claim 2, wherein said first legs of the front and rear frame members are of L-section.

4. The chassis construction according to claim 1, further including a top cover panel overlying said front and rear frame members the side edges of said top cover panel terminating at the juncture of said flanges and their inwardly-extending tongues, such that the outer face of said top cover panel is flush with the outer faces of said flanges in said side panels.

5. The chassis construction according to claim 1, wherein said first legs of the front and rear frame members include inwardly-extending tongues to which said main supporting panel is secured.

6. The chassis construction according to claim 5, wherein said first legs of the front and rear frame members are of U-section and terminate in said inwardly-extending tongues for securement of said main supporting panel.

7. The chassis construction according to claim 6, further including front and rear cover panels secured to the outer faces of said front and rear frame members.

8. The chassis construction according to claim 6, further including a bottom cover panel secured to the bottom faces of said front and rear frame members such that said main supporting panel is spaced upwardly from said bottom cover panel.

* * * * *